United States Patent [19]

Sim

[11] Patent Number: 5,619,467
[45] Date of Patent: Apr. 8, 1997

[54] SENSE AMPLIFIER FOR SEMICONDUCTOR MEMORY DEVICE HAVING FEEDBACK CIRCUITS

[75] Inventor: Jai-Hoon Sim, Kyungki-do, Rep. of Korea

[73] Assignee: Samsung Electronics Co., Ltd., Suwon, Rep. of Korea

[21] Appl. No.: 623,790

[22] Filed: Mar. 29, 1996

[30] Foreign Application Priority Data

Mar. 31, 1995 [KR] Rep. of Korea .................... 7518/1995

[51] Int. Cl.$^6$ .................................................. G11C 7/06
[52] U.S. Cl. ...................... 365/208; 365/207; 365/190; 365/205; 327/54; 327/55; 327/52
[58] Field of Search ................................... 365/208, 207, 365/190, 205, 185.21; 327/54, 55, 52, 67

[56] References Cited

U.S. PATENT DOCUMENTS 5,438,287  8/1995  Faue .......................... 327/54

Primary Examiner—Viet Q. Nguyen
Assistant Examiner—Andrew Q. Tran
Attorney, Agent, or Firm—Cushman Darby & Cushman IP Group of Pillsbury Madison & Sutro LLP

[57] ABSTRACT

A current sense amplifier circuit for a semiconductor memory device includes a differential amplifier which senses the signal currents input to first and second input nodes, amplifies the difference between the two signals and outputs the sense-amplified signals to first and second output nodes. A first feedback circuit is connected between the second input node and a current controlling node and has a controlling terminal connected to the first output node. A second feedback circuit is connected between the first input node and the current controlling node and has a controlling terminal connected to the second output node. By feeding back voltages from the counterpart output nodes through the cross-connected feedback circuits, the difference between low level input signals can be efficiently detected and a stable sense-amplified output is obtained.

16 Claims, 3 Drawing Sheets

5,619,467

SENSE AMPLIFIER FOR SEMICONDUCTOR MEMORY DEVICE HAVING FEEDBACK CIRCUITS

BACKGROUND OF THE INVENTION

1. Field of the Invention

The present invention relates to a sense amplifier circuit for a semiconductor memory device, and more particularly, to a current sensing amplifier circuit.

2. Description of Related Art

FIG. 1 is circuit diagram of a conventional current sensing amplifier circuit for a semiconductor memory device. First and second input current signals I1 and I2 are converted into voltage signals at first and second input nodes N1 and N2 by PMOS transistors Q1 and Q2, respectively. Then, the voltages of the first and second input nodes N1 and N2 are amplified by the positive feedback operations of PMOS transistors Q3 and Q4 and then output to the first and second output nodes N3 and N4.

The voltage levels of the first and second output signals O1 and O2 are determined by the size ratios of PMOS transistors Q3 through Q6. Accordingly, in order to increase the voltage levels of the first and second output signals O1 and O2 in the conventional current sense amplifier circuit, the size of the PMOS transistors Q3 through Q6 must be adjusted or the amount of current of the first and second input signals I1 and I2 must be increased.

FIG. 2 illustrates the simulation results of the output signals O1 and O2 obtained by amplifying the difference between the input signals I1 and I2 in the conventional current sense amplifier circuit of FIG. 1. However, in the conventional current sense amplifier circuit, when the current values of the input signals I1 and I2 are low, the sensing capability of the circuit is lowered. In addition, when the operational voltage is lowered or when a parasitic capacitance increases, the sensing capability is also lowered.

SUMMARY OF THE INVENTION

An object of the invention is to solve the problems of prior art and to provide a current sense amplifier circuit for a semiconductor memory device which senses low level input signals with high sensitivity.

Another object of the invention is to provide a current sense amplifier circuit for a semiconductor memory device which efficiently senses a low level input signal by controlling a corresponding input node according to the voltage level of the output node.

Another object of the invention is to provide a current sense amplifier circuit for a semiconductor memory device which efficiently senses low level input signals even when an operational voltage is lowered or a parasitic capacitance is increased.

To achieve these and other objects, a current sense amplifier circuit for a semiconductor memory device according to the present invention includes a differential amplifier which senses the signal currents input to first and second input nodes, amplifies the difference between the two signals and outputs the sense-amplified signals to first and second output nodes. A first feedback circuit is connected between the second input node and a current controlling node and has a controlling terminal connected to the first output node. A second feedback circuit is connected between the first input node and the current controlling node and has a controlling terminal connected to the second output node. By feeding back voltages from the counterpart output nodes through the cross-connected feedback circuits, the difference between low level input signals can be efficiently detected and a stable sense-amplified output is obtained.

BRIEF DESCRIPTION OF THE ATTACHED DRAWINGS

DETAILED DESCRIPTION OF THE PREFERRED EMBODIMENT

Figure 1:
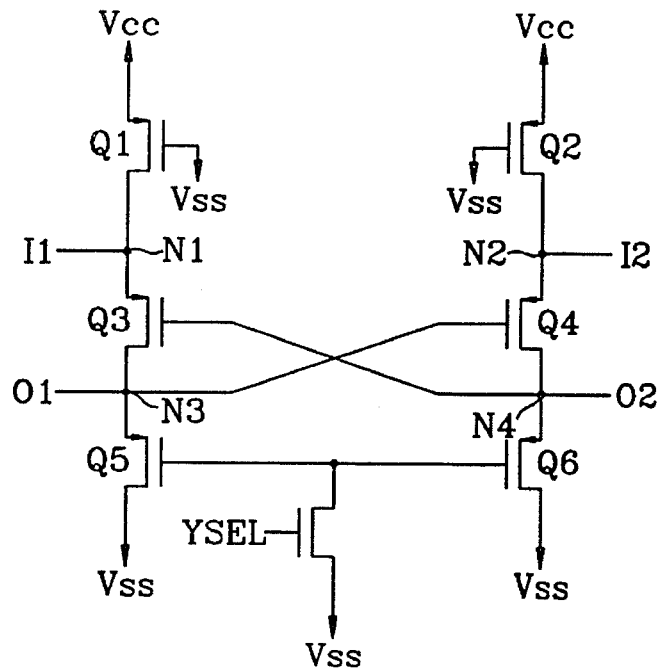
FIG. 1 is a circuit diagram of a conventional sense amplifier circuit for a semiconductor memory device.
Figure 3:
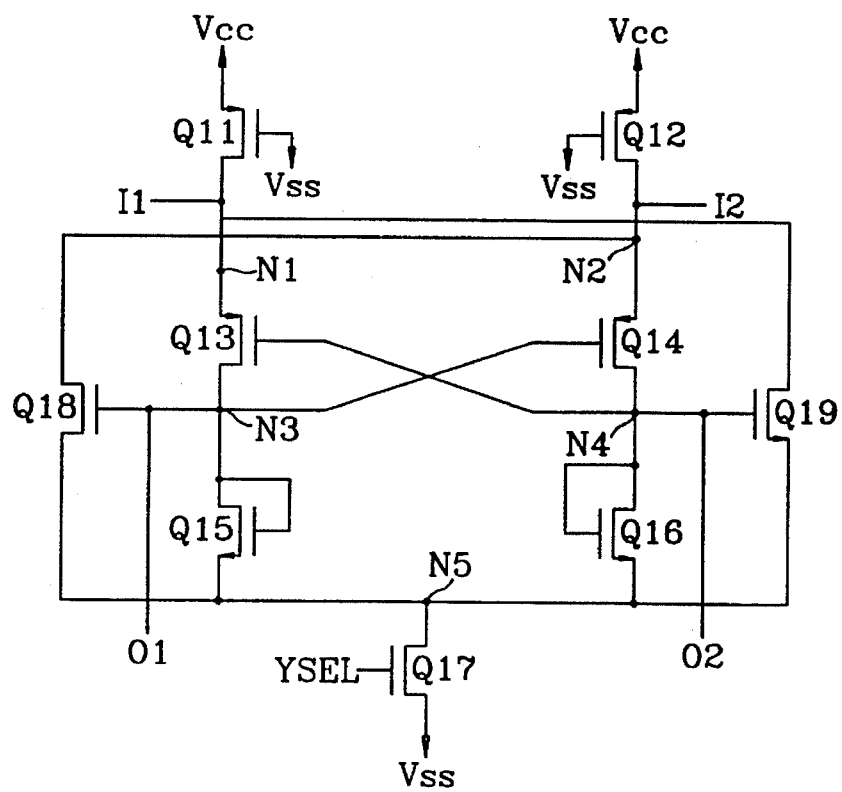
FIG. 3 illustrates a first preferred embodiment of a sense amplifier circuit for a semiconductor memory device according to the present invention.
Figure 2:
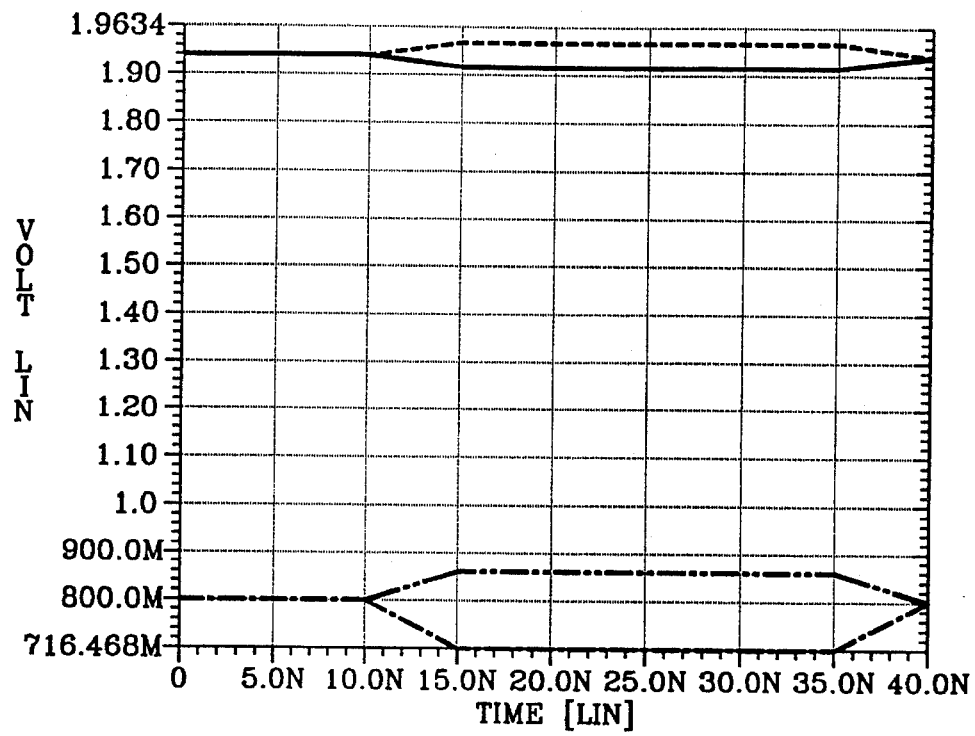
FIG. 2 is a graph illustrating input/output characteristics of the circuit of FIG. 1.

FIG. 3 illustrates a current sense amplifier circuit according to the present invention. In the circuit, a PMOS transistor Q11 is connected between a power supply voltage and a first input node N1 and its gate electrode is connected to a ground voltage. A PMOS transistor Q12 is connected between a power supply voltage and a second input node N2 and its gate electrode is connected to a ground voltage. The PMOS transistors Q11 and Q12 are bias transistors respectively connected between the first voltage terminal and the first and second input nodes N1 and N2.

A PMOS transistor Q13 is connected between first input node N1 and a first output node N3 and its gate electrode is connected to a second output node N4. A PMOS transistor Q14 is connected between second input node N2 and a second output node N4 and its gate electrode is connected to the first output node N3. The PMOS transistors Q13 and Q14, being first and second amplifying transistors, are connected respectively between the first and second input nodes and the first and second output nodes and have their gate electrodes cross-connected to the first and second output nodes.

An NMOS transistor Q15 has a drain electrode and a gate electrode commonly connected to the first output node N13 and a source electrode connected to the current control node N5. An NMOS transistor Q16 has a drain and a gate electrode commonly connected to the second output node N4 and a source electrode connected to a current control node N5. The NMOS transistors Q15 and Q16 form first and a second diode-type load transistors respectively connected between the current control node N5 and the first and second output nodes.

An NMOS transistor Q17, being a current control transistor, is connected between the current control node N5 and a ground voltage, and its gate electrode is connected to the controlling signal YSEL.

An NMOS transistor Q18, being a first feedback transistor, is connected between the second input node N2 and the current control node N5 and its gate electrode is connected to the first output node N3. An NMOS transistor Q19, being a second feedback transistor, is connected between the first input node N1 and the current control node N5 and its gate electrode is connected to the second output node N4.

An operation of the sense amplifier circuit of the present invention is described below with reference to FIG. 3. The input signals I1 and I2, being small current signals, are respectively applied to nodes N1 and N2. At this time, because PMOS transistors Q11 and Q12 are biased to maintain the power-on state, the currents of input signals I1 and I2 are converted into voltage signals at the nodes N1 and N2. The voltages are at the low level.

Consequently, PMOS transistors Q13 and Q14, being drain-to-gate cross coupled transistors, amplify the voltage difference of the two input signals and respectively output to output nodes N3 and N4. The signals of the output node N3 and N4 are output through the NMOS transistors Q15 and Q16, being diode-type load transistors. The amplifying amounts of the output nodes N3 and N4 are determined by the size of the transistors Q13 through Q16.

The conductivity amount of NMOS transistor Q18, having its drain electrode connected to the second input node N2 and its source electrode connected to the current control node N5, is determined according to the amplified voltage level output to the first output node N3. Accordingly, NMOS transistor Q18 feeds back the output of the first output node N3 to the second input node N2. Likewise, the conductivity amount of NMOS transistor Q19, having its drain electrode connected to the first input node N1 and its source electrode connected to the current control node N5, is determined by the amplified voltage level output to the second output node N4. Accordingly, NMOS transistor Q19 feeds back the output of the second output node N4 to the first input node N1.

As the voltages of the output nodes N3 and N4 are fed back to the input nodes N1 and N2, the difference between the input signals I1 and I2 is amplified. Therefore, the amplifying amounts of the output signals O1 and O2 are increased.

Figure 4:
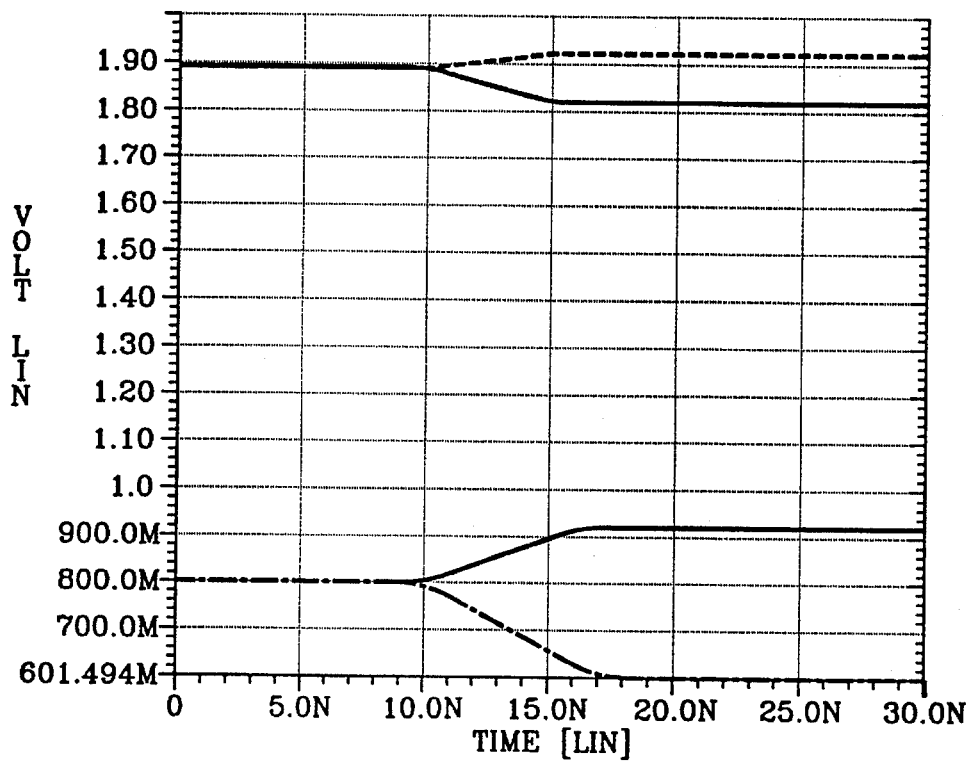
FIG. 4 is a graph illustrating input/output characteristics of the circuit of FIG. 3.

For instance, whene first input signal I1 has a higher current value relative to second input signal I2, the voltage of the first input node N1 is higher than that of the second input node N2. Then, because PMOS transistor Q13 conducts more than PMOS transistor Q14, the voltage of the first output node N3 is higher than that of the second output node N4. Accordingly, NMOS transistor Q18 conducts more than NMOS transistor Q19, and the current path formed through NMOS transistor Q18 is larger than that formed through NMOS transistor Q19. Then, because the electric potential of the second input node N2 is lowered more quickly than that of the first input node N1, the difference between the two input signals I1 and I2 is more greatly amplified. Therefore, the output signals O1 and O2 are output with a correct logic value as illustrated in FIG. 4. In this illustration, the threshold voltages of transistors Q11 through Q19 are below 0.5 V.

Figure 5:
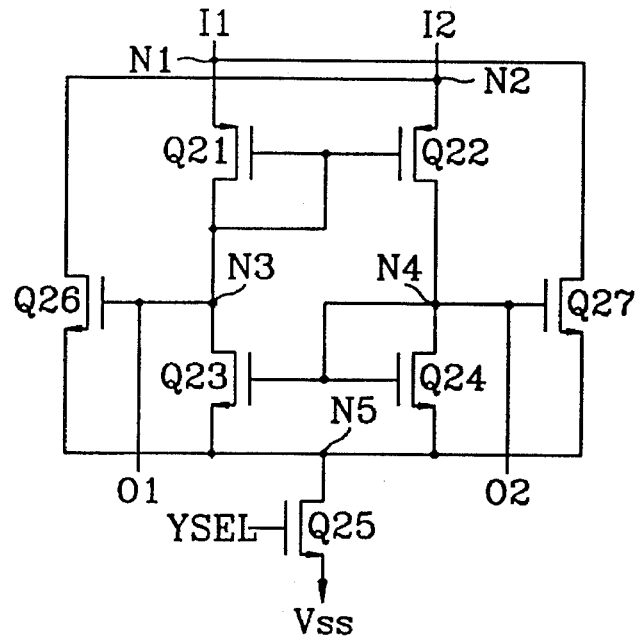
FIG. 5 illustrates a second preferred embodiment of a sense amplifier circuit for a semiconductor memory device according to the present invention.

FIG. 5 is a circuit diagram of a second embodiment of the current sense amplifier circuit according to the present invention. In this circuit, PMOS transistor Q21 is connected between first input node N1 and first output node N3 and its gate electrode is connected to the first output node N3. PMOS transistor Q22 is connected between second input node N2 and second output node N4 and its gate electrode is connected to the first output node N3. PMOS transistors Q21 and Q22 form first and second amplifying transistors.

An NMOS transistor Q23 has a drain electrode connected to the first output node N3, a gate electrode connected to the second output node N4, and a source electrode connected to the current control node N5. An NMOS transistor Q24 has its drain and gate electrodes commonly connected to the second output node N4 and a source electrode connected to the current control node N5. The NMOS transistors Q23 and Q24 form the first and second load transistors.

An NMOS transistor Q25, being a current control transistor, is connected between the current control node N5 and a ground voltage, and its gate electrode is connected to the controlling signal YSEL.

An NMOS transistor Q26, being the first feedback transistor, is connected between the second input node N2 and the current control node N5, and its gate electrode is connected to the first output node N3. An NMOS transistor Q27, being the second feedback transistor, is connected between the first input node N1 and the current control node N5, and its gate electrode is connected to the second output node N4.

As illustrated in FIG. 5, the conductivities of PMOS transistors Q21 and Q22 are determined by the voltage level of the output signal O1 output from the first output node N3. Likewise, the conductivities of NMOS transistors Q23 and Q24 are determined by the voltage level of the output signal O2 output from the second output node N4.

The above-described configuration is a variation of the differential amplifier circuit as illustrated in FIG. 3, and the operation thereof is the same. In particular, NMOS transistors Q26 and Q27 greatly amplify the difference between the input signals I1 and I2 by controlling the input nodes N1 and N2 according to the voltages of the output nodes N3 and N4, as performed by the NMOS transistors Q18 and Q19 in FIG. 3.

Figure 6:
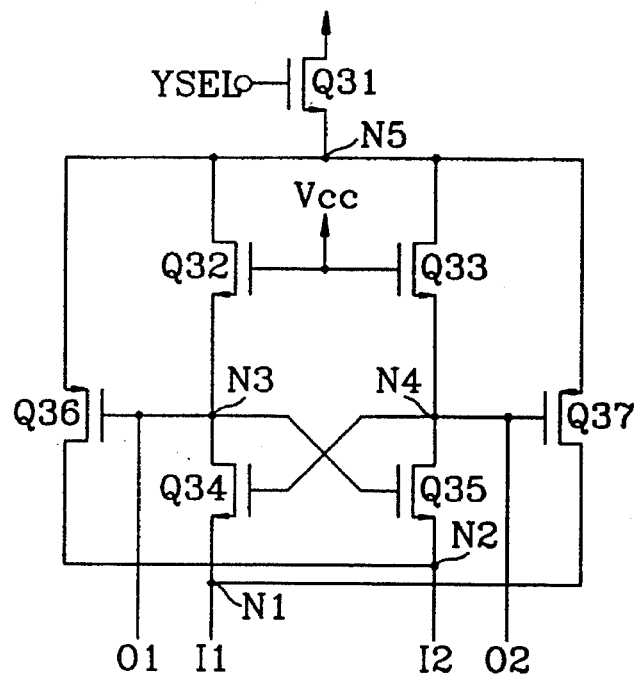
FIG. 6 illustrates a third preferred embodiment of a sense amplifier circuit for a semiconductor memory device according to the present invention.

FIG. 6 is a circuit diagram of a third embodiment of the current sense amplifier circuit according to the present invention. In this circuit, as illustrated in FIG. 6, an NMOS transistor Q31 is connected between the power supply voltage and the node N5, and its gate electrode is connected to the current control signal YSEL.

NMOS transistor Q32 is connected between the node N5 and the first output node N3, and its gate electrode is connected to the power supply voltage. An NMOS transistor Q33 is connected between the current control node N5 and the second output node N4, and its gate electrode is connected to the power supply voltage.

NMOS transistor Q34 is connected between the first output node N3 and the first input node N1, and its gate electrode is connected to the second output node N4. An NMOS transistor Q35 is connected between the second output node N4 and the second input node N2, and its gate electrode is connected to the first output node N3.

A PMOS transistor Q36, being a first feedback transistor, is connected between the current control node N5 and the second input node N2, and its gate electrode is connected to the first output node N3. PMOS transistor Q37, being a second feedback transistor, is connected between the node N5 and the first input node N1, and its gate electrode is connected to the second output node N4.

As illustrated in FIG. 6, PMOS transistors Q36 and Q37 are embodied as the gate controlled current feedback transistors.

In the current sense amplifying circuits described above, through feeding back the voltages from the counterpart output nodes to the cross-connected counterpart inputs, the present invention can greatly extend the difference between input signals having minute current values, thereby generating a stable sense output from small current signals and large input load capacitances.

Although the present invention has been described above with reference to the preferred embodiments thereof, those skilled in the art will readily appreciate that various modifications and substitutions can be made thereto without departing from the spirit and scope of the invention as set forth in the appended claims.

What is claimed is:

1. A sense amplifier for a semiconductor memory device, comprising:

a differential amplifier which senses first and second input signals respectively received at first and second input nodes and amplifies a difference between said input signals to cause an amplified difference between first and second difference signals at first and second output nodes;

a first feedback circuit coupled between said second input node and a current control node, said first feedback circuit being controlled by said first difference signal from said first output node; and a second feedback circuit coupled between said first input node and said current control node, said second feedback circuit being controlled by said second difference signal from said second output node, said first feedback circuit and said second feedback circuit further increasing said amplified difference across said first and second output nodes.

2. A sense amplifier according to claim 1, wherein said first and second feedback circuits are NMOS transistors.

3. A sense amplifier according to claim 1, wherein said input signals are current signals and wherein said amplified difference is a voltage difference.

4. A sense amplifier for a semiconductor memory device, comprising:

first and second bias elements respectively connected between a first voltage terminal and first and second input nodes;

first and second amplifier transistors respectively connected between said first and second input nodes and first and second output nodes, said amplifier transistors having gate electrodes respectively cross-connected to said first and second output nodes;

first and second load elements respectively connected between said first and second output nodes and a current control node;

a current control transistor connected between said current control node and a second voltage terminal, said current control transistor having a gate electrode connected to a control terminal;

a first feedback circuit connected between said second input node and said current control node, said first feedback circuit being controlled by a first difference signal at said first output node; and a second feedback circuit connected between said first input node and said current control node, said second feedback circuit being controlled by a second difference signal at said second output node.

5. A sense amplifier according to claim 4, wherein said first and second bias elements are transistors and said first and second load elements are transistors connected to form diodes.

6. A sense amplifier according to claim 4, wherein threshold voltages of said first and second bias elements, said first and second amplifier transistors, and said first and second load elements are below 0.5 V.

7. A sense amplifier according to claim 6, wherein said first voltage terminal receives a power supply voltage and said second voltage terminal receives a ground voltage.

8. A sense amplifier according to claim 4, wherein said first and second feedback circuits are comprised of NMOS transistors.

9. A sense amplifier for a semiconductor memory device, comprising:

first and second amplifier transistors respectively connected between first and second input nodes and first and second output nodes, said amplifier transistors both having gate electrodes connected to said first output node;

first and second load transistors respectively connected between said first and second output nodes and a current control node, said load transistors both having gate electrodes connected to said second output node;

a current control transistor connected between said current control node and a voltage terminal, said current control transistor having a gate electrode connected to a control terminal;

a first feedback circuit connected between said second input node and said current control node, said first feedback circuit being controlled by a first difference signal at said first output node; and a second feedback circuit connected between said first input node and said current control node, said second feedback circuit being controlled by a second difference signal at said second output node.

10. A sense amplifier according to claim 9, wherein threshold voltages of said first and second amplifier transistors and said first and second load transistors are below 0.5 V.

11. A sense amplifier according to claim 10, wherein said voltage terminal receives a ground voltage.

12. A sense amplifier according to claim 9, wherein said first and second feedback circuits are comprised of NMOS transistors.

13. A sense amplifier for a semiconductor memory device, comprising:

first and second amplifier transistors respectively connected between first and second input nodes and first and second output nodes, said amplifier transistors having gate electrodes cross-connected to said first and second output nodes;

first and second load transistors respectively connected between said first and second output nodes and a current control node, said load transistors both having gate electrodes connected to a voltage terminal;

a current control transistor connected between said current control node and said voltage terminal, said current control transistor having a gate electrode connected to a control terminal;

a first feedback circuit connected between said second input node and said current control node, said first feedback circuit being controlled by a first difference signal at said first output node; and a second feedback circuit connected between said first input node and said current control node, said second feedback circuit being controlled by a second difference signal at said second output node.

14. A sense amplifier according to claim 13, wherein threshold voltages of said first and second amplifier transistors and said first and second load transistors are below 0.5 V.

15. A sense amplifier according to claim 14, wherein said voltage terminal receives a power supply voltage.

16. A sense amplifier according to claim 13, wherein said first and second feedback circuits are comprised of PMOS transistors.

* * * * *